United States Patent
Tani et al.

(10) Patent No.: US 8,866,312 B2
(45) Date of Patent: Oct. 21, 2014

(54) SEMICONDUCTOR APPARATUS, METHOD FOR MANUFACTURING THE SAME AND ELECTRIC DEVICE

(75) Inventors: Motoaki Tani, Kawasaki (JP); Keishiro Okamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 176 days.

(21) Appl. No.: 13/358,840

(22) Filed: Jan. 26, 2012

(65) Prior Publication Data

US 2012/0217660 A1 Aug. 30, 2012

(30) Foreign Application Priority Data

Feb. 25, 2011 (JP) ................................. 2011-040674

(51) Int. Cl.

| | | |
|---|---|---|
| *H01L 23/48* | (2006.01) | |
| *H01L 23/00* | (2006.01) | |
| H01L 23/498 | (2006.01) | |
| H01L 23/66 | (2006.01) | |
| H01L 23/14 | (2006.01) | |
| H01L 23/13 | (2006.01) | |
| H01L 23/373 | (2006.01) | |
| H01L 23/31 | (2006.01) | |

(52) U.S. Cl.
CPC ....... *H01L 24/29* (2013.01); *H01L 2224/04042* (2013.01); *H01L 2924/01029* (2013.01);

(Continued)

(58) Field of Classification Search
CPC .......... H01L 2924/01079; H01L 2924/01005; H01L 2924/01029; H01L 2924/01013; H01L 24/83
USPC .................. 257/783, 780, 781, 779, 712, 713
See application file for complete search history.

(56) References Cited

U.S. PATENT DOCUMENTS

| | | | |
|---|---|---|---|
| 5,519,936 A | 5/1996 | Andros et al. | |
| 7,786,568 B2* | 8/2010 | Chen | 257/698 |
| 2009/0261483 A1* | 10/2009 | Katogi et al. | 257/783 |

FOREIGN PATENT DOCUMENTS

| | | |
|---|---|---|
| CN | 1215920 | 5/1999 |
| JP | 62-71301 | 4/1987 |

(Continued)

OTHER PUBLICATIONS

First Office Action issued Jan. 30, 2014 from the State Intellectual Property Office of the People's Republic of China in counterpart application No. 201210034475.3 with English translation.

*Primary Examiner* — Hoa B Trinh
(74) *Attorney, Agent, or Firm* — Kratz, Quintos & Hanson, LLP

(57) ABSTRACT

A semiconductor apparatus includes: a semiconductor device including a first electrode; a substrate including a second electrode and a recess; and a heat-dissipating adhesive material to set the semiconductor device in the recess so as to arrange the first electrode close to the second electrode, wherein the first electrode is coupled to the second electrode and the heat-dissipating adhesive material covers a bottom surface and at least part of a side surface of the semiconductor device.

13 Claims, 17 Drawing Sheets

(52) U.S. Cl.
CPC ....... *H01L 24/32* (2013.01); *H01L 2224/73265* (2013.01); *H01L 2224/05664* (2013.01); *H01L 2224/92247* (2013.01); *H01L 2224/48647* (2013.01); *H01L 2224/48699* (2013.01); *H01L 2224/48599* (2013.01); *H01L 2224/05624* (2013.01); *H01L 2924/142* (2013.01); *H01L 2224/05644* (2013.01); *H01L 2224/94* (2013.01); *H01L 2224/06181* (2013.01); *H01L 2924/10253* (2013.01); *H01L 23/49822* (2013.01); *H01L 2224/29116* (2013.01); *H01L 2224/29118* (2013.01); *H01L 2924/15153* (2013.01); *H01L 2224/2912* (2013.01); *H01L 2924/1033* (2013.01); *H01L 2224/05558* (2013.01); *H01L 2224/0345* (2013.01); *H01L 24/06* (2013.01); *H01L 2224/2929* (2013.01); *H01L 2224/48624* (2013.01); *H01L 2224/45164* (2013.01); *H01L 24/92* (2013.01); *H01L 2224/29109* (2013.01); *H01L 24/45* (2013.01); *H01L 2224/29147* (2013.01); *H01L 2224/05655* (2013.01); *H01L 2224/0558* (2013.01); *H01L 2224/49175* (2013.01); *H01L 2224/04026* (2013.01); *H01L 23/66* (2013.01); *H01L 2224/06155* (2013.01); *H01L 2924/1047* (2013.01); *H01L 23/142* (2013.01); *H01L 23/13* (2013.01); *H01L 2224/45144* (2013.01); *H01L 23/3737* (2013.01); *H01L 2224/29113* (2013.01); *H01L 2224/32245* (2013.01); *H01L 2224/29111* (2013.01); *H01L 2224/48664* (2013.01); *H01L 2224/32225* (2013.01); *H01L 2224/05647* (2013.01); *H01L 24/48* (2013.01); *H01L 2224/05554* (2013.01); *H01L 2224/48644* (2013.01); *H01L 2224/83192* (2013.01); *H01L 2224/03452* (2013.01); *H01L 2924/10344* (2013.01); *H01L 2224/05666* (2013.01); *H01L 2924/13064* (2013.01); *H01L 24/73* (2013.01); *H01L 2224/48091* (2013.01); *H01L 24/49* (2013.01); *H01L 2224/29339* (2013.01); *H01L 2224/48227* (2013.01); *H01L 2224/29139* (2013.01); *H01L 2224/83191* (2013.01); *H01L 2224/45147* (2013.01); *H01L 24/05* (2013.01); *H01L 2224/29344* (2013.01); *H01L 24/03* (2013.01); *H01L 2224/45124* (2013.01); *H01L 24/83* (2013.01); *H01L 2224/48799* (2013.01); *H01L 23/3121* (2013.01)
USPC .......................................................... 257/783

(56) References Cited

FOREIGN PATENT DOCUMENTS

| | | |
|---|---|---|
| JP | 3-145739 | 6/1991 |
| JP | 5-121589 | 5/1993 |
| JP | 2000-58714 | 2/2000 |

* cited by examiner

SEMICONDUCTOR APPARATUS, METHOD FOR MANUFACTURING THE SAME AND ELECTRIC DEVICE

CROSS-REFERENCE TO RELATED APPLICATIONS

This application claims the benefit of priority from Japanese Patent Application No. 2011-40674 filed on Feb. 25, 2011, the entire contents of which are incorporated herein by reference.

FIELD

Embodiments disclosed herein relate to semiconductor apparatuses, methods for manufacturing semiconductor apparatuses and an electric device.

BACKGROUND

Since Nitride semiconductors have characteristics including high electron saturation velocity and a wide band gap, they may be applied to high-breakdown voltage, high-power semiconductor devices GaN, an example of a nitride semiconductor, has a wider band gap than silicon (1.1 eV) and GaAs (1.4 eV), for example, 3.4 eV; therefore, it has high breakdown field strength. Therefore, GaN may be used as a material for power devices that operate at high voltage and output high voltage for power supply applications.

The related art is disclosed in Japanese Laid-open Patent Publication Nos. 62-71301 and 5-121589 and Japanese Patent No. 3127895.

SUMMARY

According to one aspect of the embodiments, a semiconductor apparatus includes: a semiconductor device including a first electrode; a substrate including a second electrode and a recess; and a heat-dissipating adhesive material to set the semiconductor device in the recess so as to arrange the first electrode close to the second electrode, wherein the first electrode is coupled to the second electrode and the heat-dissipating adhesive material covers a bottom surface and at least part of a side surface of the semiconductor device.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 1:
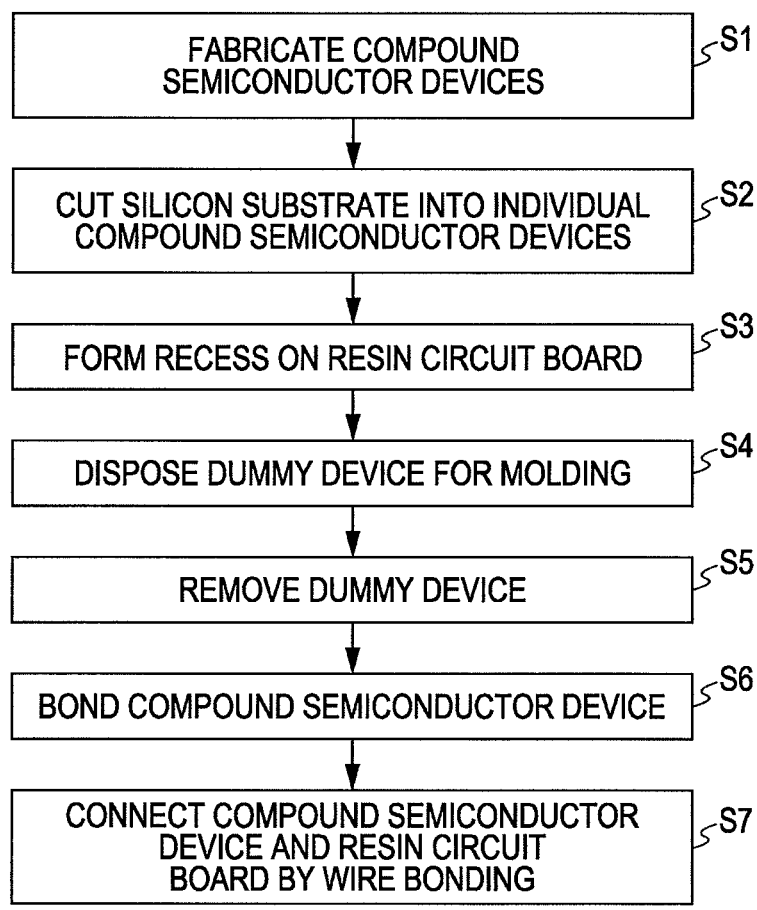
FIG. 1 illustrates an exemplary semiconductor package manufacturing process.

Low-resistance transmission may be taken into account for power devices through which a large current flows. High heat dissipation may be taken into account for power devices that radiate large amounts of heat. For example, if a semiconductor device is mounted face-up on a flat circuit board by a low-cost wire bonding method, the wires may be made shorter or thicker for a low-resistance-transmission package.

For the sake of convenience, the accurate sizes and accurate thicknesses may not be depicted in the drawings below.

FIG. 1 illustrates an exemplary semiconductor package manufacturing process. FIGS. 2A to 2F illustrate an exemplary a semiconductor device manufacturing process. AlGaN/GaN high electron mobility transistors (HEMTs) may be manufactured by the semiconductor device manufacturing process illustrated in FIGS. 2A to 2F. Compound semiconductor devices are manufactured through Operations S1 and S2 in FIG. 1, and semiconductor packages are manufactured through Operations S3 to S6 in FIG. 1.

In the operation S1 in FIG. 1, semiconductor devices for mounting on resin circuit boards, for example, compound semiconductor devices having an HEMT structure, are manufactured. For example, AlGaN/GaN HEMTs, which are nitride semiconductor devices, may be manufactured. Alternatively, for example, InAlN/GaN HEMTs or InAlGaN/GaN HEMTs may be manufactured. Nitride semiconductor devices other than HEMTs, compound semiconductor devices other than nitride semiconductor devices, semiconductor memories, or other semiconductor devices may also be manufactured.

Figure 2A:
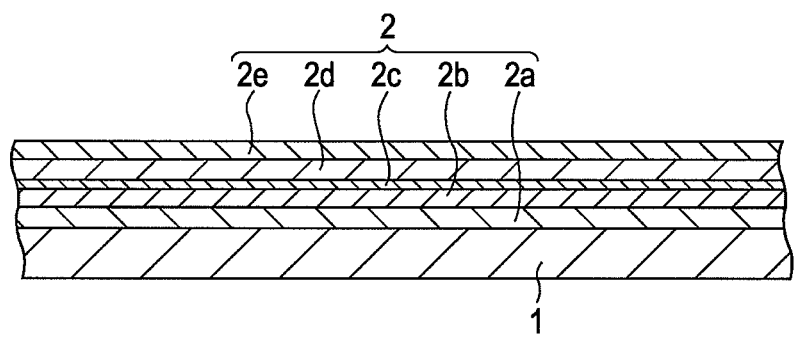
FIGS. 2A to 2F illustrate an exemplary semiconductor device manufacturing process.

Referring to FIG. 2A, a layered compound semiconductor structure 2 is formed on a growth substrate, for example, a silicon substrate 1. For example, a silicon substrate, a SiC substrate, a sapphire substrate, a GaAs substrate, or a GaN substrate may be used as the growth substrate. The substrate may be a semi-insulating or conductive substrate. The layered compound semiconductor structure 2 may include a buffer layer 2a, an electron transit layer 2b, an intermediate layer 2c, an electron supply layer 2d, and a capping layer 2e.

In an operation of the AlGaN/GaN HEMT, the AlGaN/GaN HEMT generates a two-dimensional electron gas (2DEG) near the interface between the electron transit layer 2b and the electron supply layer 2d, for example, the interface between the electron transit layer 2b and the intermediate layer 2c. The 2DEG may be generated based on the difference between the lattice constant of the compound semiconductor of the electron transit layer 2b, for example, GaN, and the lattice constant of the compound semiconductor of the electron supply layer 2d, for example, AlGaN.

Sequentially formed on the silicon substrate 1 are an AlN layer having a thickness of about 0.1 μm, an intentionally undoped GaN (i-GaN) layer having a thickness of about 3 μm, an i-AlGaN layer having a thickness of about 5 nm, an n-AlGaN layer having a thickness of about 30 nm, and an n-GaN layer having a thickness of about 10 nm. These compound semiconductors are formed by, for example, metal-organic vapor phase epitaxy (MOVPE). Instead of MOVPE, for example, molecular beam epitaxy (MBE) may be used. Thus, the buffer layer 2a, the electron transit layer 2b, the intermediate layer 2c, the electron supply layer 2d, and the capping layer 2e are formed.

As the growth conditions of AlN, GaN, AlGaN, and GaN, a mixture of trimethylaluminum gas, trimethylgallium gas, and ammonia gas may be used as the source gas. The presence or absence of a supply of trimethylaluminum gas, which is an aluminum source, and a supply of trimethylgallium gas, which is a gallium source, and the flow rates thereof may be determined depending on the compound semiconductor layers grown. The flow rate of ammonia gas, which is a common source gas, may be about 100 ccm to 10 Lm. The growth pressure may be about 50 to 300 Torr. The growth temperature may be about 1,000° C. to 1,200° C.

When forming n-type GaN and AlGaN, for example, $SiH_4$ gas including silicon serving as an n-type impurity is added to the source gas at a certain flow rate to dope GaN and AlGaN with silicon. The silicon doping concentration may be about $1×10^{18}/cm^3$ to $1×10^{20}/cm^3$, for example, about $5×10^{18}/cm^3$.

Figure 2B:
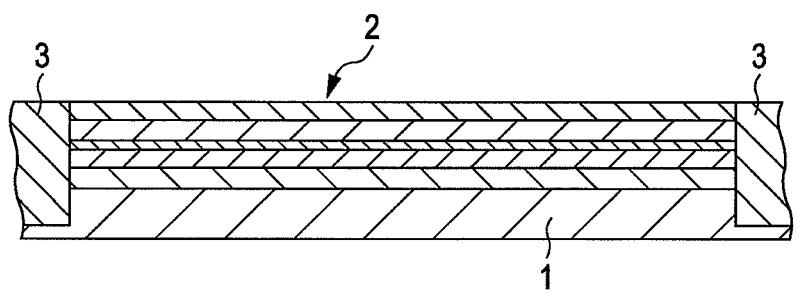

Referring to FIG. 2B, isolation structures 3 are formed. In FIGS. 2C to 2F, the isolation structures 3 may be omitted. For example, argon (Ar) is implanted into the isolation regions of the layered compound semiconductor structure 2. The isolation structures 3 are formed in the layered compound semiconductor structure 2 and the surface region of the silicon substrate 1. The isolation structures 3 define active regions in the layered compound semiconductor structure 2. Instead of implantation, the isolation structures 3 may be formed by, for example, shallow trench isolation (STI). For dry etching of the layered compound semiconductor structure 2, for example, a chlorine-containing etching gas may be used.

Figure 2C:
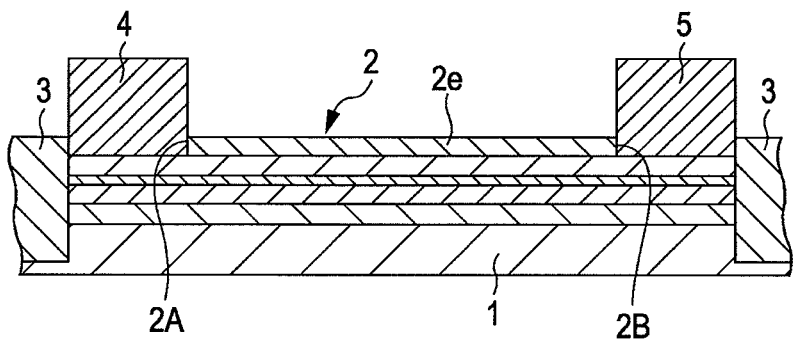

Referring to FIG. 2C, a source electrode 4 and a drain electrode 5 are formed. Electrode recesses 2A and 2B are formed at the positions where the source electrode 4 and the drain electrode 5 are to be formed, for example, electrode formation positions, on the surface of the layered compound semiconductor structure 2. The surface of the layered compound semiconductor structure 2 is applied with a resist. The resist is then processed by lithography to form openings which expose the surface of the layered compound semiconductor structure 2 corresponding to the electrode formation positions. Thus, a resist mask having openings are formed.

Using the resist mask, the capping layer 2e is removed from the electrode formation positions by dry etching until the surface of the electron supply layer 2d is exposed. Thus, the electrode recesses 2A and 2B are formed at the electrode formation positions, where the surface of the electron supply layer 2d is exposed. The etching gas used may be an inert gas such as argon and a chlorine-containing gas such as $Cl_2$. As the etching conditions, for example, the flow rate of $Cl_2$ is set to 30 sccm, the pressure is set to 2 Pa, and the RF input power is set to 20 W. The electrode recesses 2A and 2B may be formed by terminating etching somewhere in the capping layer 2e or by continuing etching to the electron supply layer 2d or the underlying layers. The resist mask is removed by, for example, ashing.

A resist mask for forming the source electrode 4 and the drain electrode 5 is formed. For example, an overhanging double-layer resist suitable for evaporation and a lift-off process may be used. The overhanging double-layer resist is applied to the layered compound semiconductor structure 2, and openings where the electrode recesses 2A and 2B are exposed are formed. Thus, a resist mask having openings is formed. Using the resist mask, an electrode material, for example, tantalum and aluminum, is deposited over the resist mask, including the openings where the electrode recesses 2A and 2B are exposed, by, for example, evaporation. Tantalum may be deposited to a thickness of about 20 nm, and aluminum may be deposited to a thickness of about 200 nm. The resist mask and the tantalum and aluminum deposited thereon are removed by a lift-off process. The silicon substrate 1 is annealed at 400° C. to 1,000° C., for example, about 600° C., for example, in a nitrogen atmosphere, so that the remaining tantalum and aluminum form an ohmic contact with the electron supply layer 2d. An ohmic contact may be formed without annealing. Thus, the electrode recesses 2A and 2B are filled with part of the electrode material, thereby forming the source electrode 4 and the drain electrode 5.

Figure 2D:
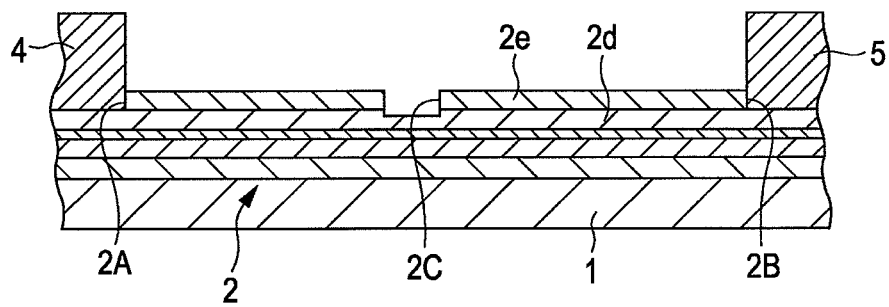

Referring to FIG. 2D, an electrode recess 2C for a gate electrode is formed on the layered compound semiconductor structure 2. The surface of the layered compound semiconductor structure 2 is applied with a resist. The resist is then processed by lithography to form an opening in which the surface of the layered compound semiconductor structure 2 corresponding to the position where the gate electrode is to be formed, for example, an electrode formation position is exposed. Thus, a resist mask having an opening is formed.

Using the resist mask, the capping layer 2e and part of the electron supply layer 2d are removed from the electrode formation position by dry etching. Thus, the electrode recess 2C is formed, which extends through the capping layer 2e and part of the electron supply layer 2d. An inert gas such as argon and a chlorine-containing gas such as $Cl_2$ may be used as the etching gas. As the etching conditions, for example, the flow rate of $Cl_2$ is set to 30 sccm, the pressure is set to 2 Pa, and the RF input power is set to 20 W. The electrode recess 2C may be formed by terminating etching somewhere in the capping layer 2e or by continuing etching to a deeper position in the electron supply layer 2d. The resist mask is removed by, for example, ashing.

Figure 2E:
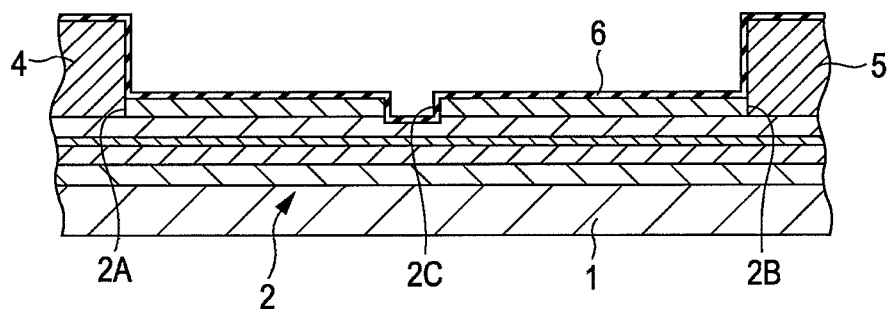

Referring to FIG. 2E, a gate insulator 6 is formed. An insulating material, for example, $Al_2O_3$, is deposited on the layered compound semiconductor structure 2 so as to cover the inner wall surfaces of the electrode recess 2C. For example, an $Al_2O_3$ layer having a thickness of about 2 to 200 nm, for example, about 10 nm, is formed by atomic layer deposition (ALD). Thus, the gate insulator 6 is formed.

Instead of ALD, $Al_2O_3$ may be deposited by, for example, plasma-enhanced chemical vapor deposition (CVD) or sputtering. Instead of $Al_2O_3$, the gate insulator 6 may be formed of aluminum nitride or oxynitride. Alternatively, an oxide, nitride, or oxynitride of silicon, hafnium, zirconium, titanium, tantalum, or tungsten, or a multilayer structure of materials selected from these materials, may be used.

Figure 2F:
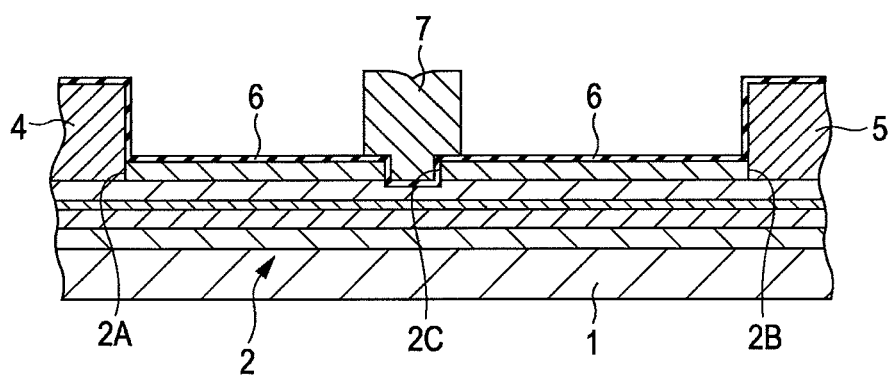

Referring to FIG. 2F, a gate electrode 7 is formed. A resist mask for forming the gate electrode 7 and a field plate electrode is formed. For example, an overhanging double-layer resist suitable for evaporation and a lift-off process is used. The overhanging double-layer resist is applied to the gate insulator 6, and an opening where the portion of the gate insulator 6 facing the electrode recess 2C is exposed is formed. Thus, a resist mask having an opening is formed.

Using the resist mask, an electrode material, for example, nickel and gold, is deposited over the resist mask, including the opening where the portion of the gate insulator 6 facing the electrode recess 2C is exposed, by, for example, evaporation. Nickel may be deposited to a thickness of about 30 nm, and gold may be deposited to a thickness of about 400 nm.

The resist mask and the nickel and gold deposited thereon are removed by a lift-off process. Thus, the electrode recess 2C is filled with part of the electrode material with the gate insulator 6 therebetween, thereby forming the gate electrode 7.

An interlayer insulator, interconnects coupled to the source electrode 4, the drain electrode 5, or the gate electrode 7, an upper protective layer, and connection electrodes exposed in the outermost surface are formed. Thus, AlGaN/GaN HEMTs are formed.

Metal-insulator-semiconductor (MIS) AlGaN/GaN HEMTs having the gate insulator 6 may be formed. Alternatively, Schottky AlGaN/GaN HEMTs that do not have the gate insulator 6, with the gate electrode 7 in direct contact with the layered compound semiconductor structure 2, may be formed. The gate recess structure in which the gate electrode 7 is formed in the electrode recess 2C may not be used, and the gate electrode 7 may be formed on a layered compound semiconductor structure 2 having no recess, directly or with the gate insulator 6 therebetween.

In the operation S2, the silicon substrate 1 having the AlGaN/GaN HEMTs formed in the operation S1 is cut into individual compound semiconductor devices, for example, individual compound semiconductor chips. The silicon substrate 1 is cut into individual compound semiconductor devices by dicing along dicing lines formed thereon using, for example, a certain laser.

Figure 3:
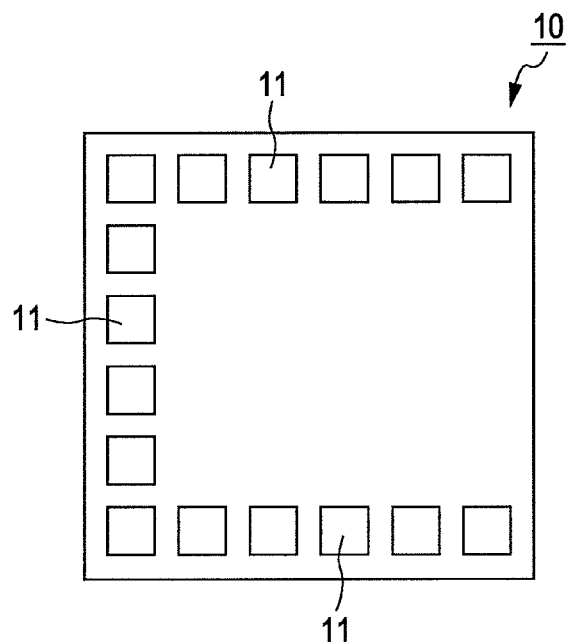
FIG. 3 illustrates an exemplary compound semiconductor device.

FIG. 3 illustrates an exemplary compound semiconductor device. The compound semiconductor device illustrated in FIG. 3 may be manufactured by the manufacturing process illustrated in FIGS. 2A to 2F. A compound semiconductor device 10 has connection electrodes 11 for external connection arranged in a line along three of the four sides of the rectangular periphery thereof. The connection electrodes 11 are coupled to, for example, source electrodes, drain electrodes, or gate electrodes through, for example, underlying interconnects.

Figure 4A:
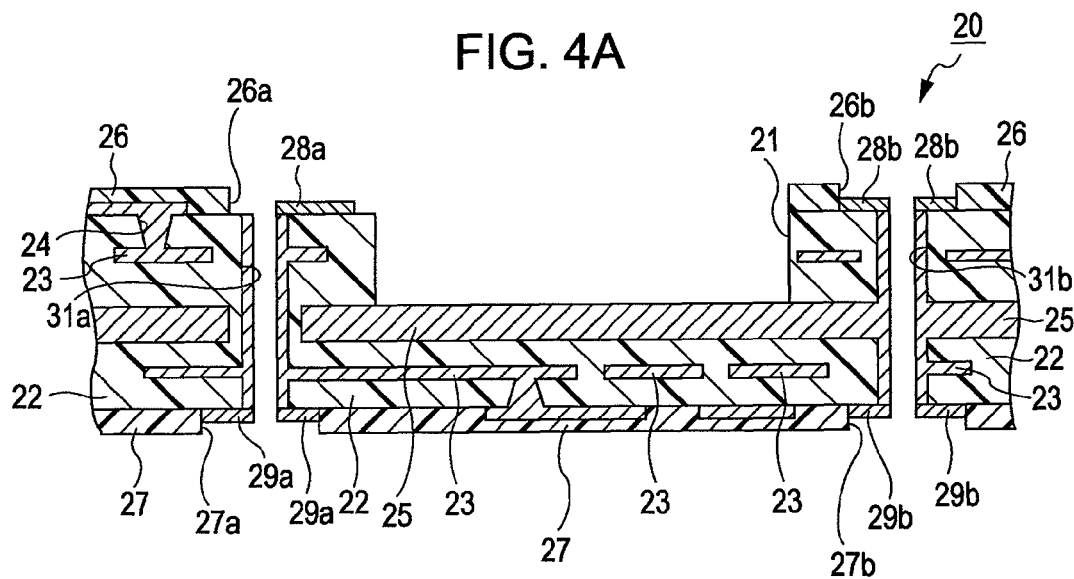
FIGS. 4A and 4B illustrate an exemplary semiconductor package.
Figure 4B:
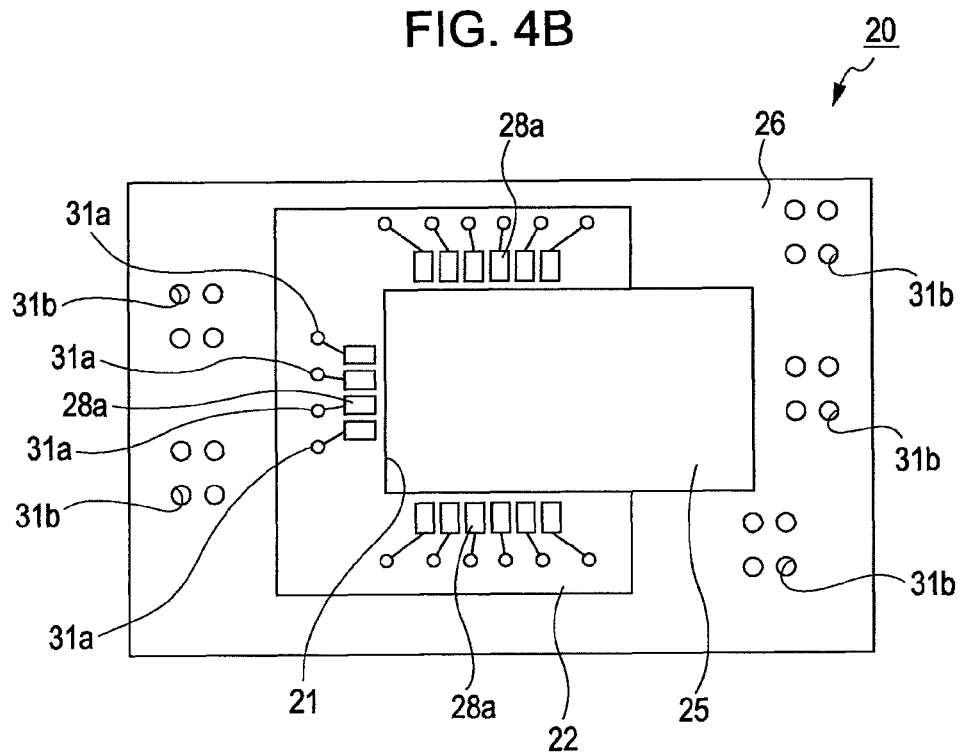

FIGS. 4A and 4B illustrate an exemplary semiconductor package. FIG. 4A indicates a sectional view, and FIG. 4B indicates a plan view. In the operation S3 in FIG. 1, as illustrated in FIGS. 4A and 4B, a recess 21, for example, a countersink or cavity 21, is formed on the front surface of a resin circuit board 20. The resin circuit board 20 has copper (Cu) interconnects 23 formed on the front and back surfaces of a resin 22. The copper interconnects 23 are coupled to each other through vias 24. A metal core 25 including a heat-dissipating metal, for example, copper, is disposed in the resin 22. Instead of copper, the metal core 25 may include at least one metal selected from gold (Au), nickel (Ni), aluminum (Al), titanium (Ti), and palladium (Pd). The front and back surfaces of the resin 22 are covered with solder resists 26 and 27, respectively. The solder resist 26 on the front surface of the resin 22 has openings 26a and 26b where parts of the front surface of the resin 22 are exposed. Connection electrodes 28a to be coupled to the connection electrodes 11 of the compound semiconductor device 10 are formed at certain positions in the opening 26a. Connection electrodes 28b for external connection are formed in the openings 26b. The solder resist 27 on the back surface of the resin 22 has openings 27a and 27b where parts of the back surface of the resin 22 are exposed. Connection electrodes 29a and 29b for external connection are formed in the openings 27a and 27b, respectively. In FIGS. 4A and 4B, the resin circuit board 20 has through-holes.

Figure 5:
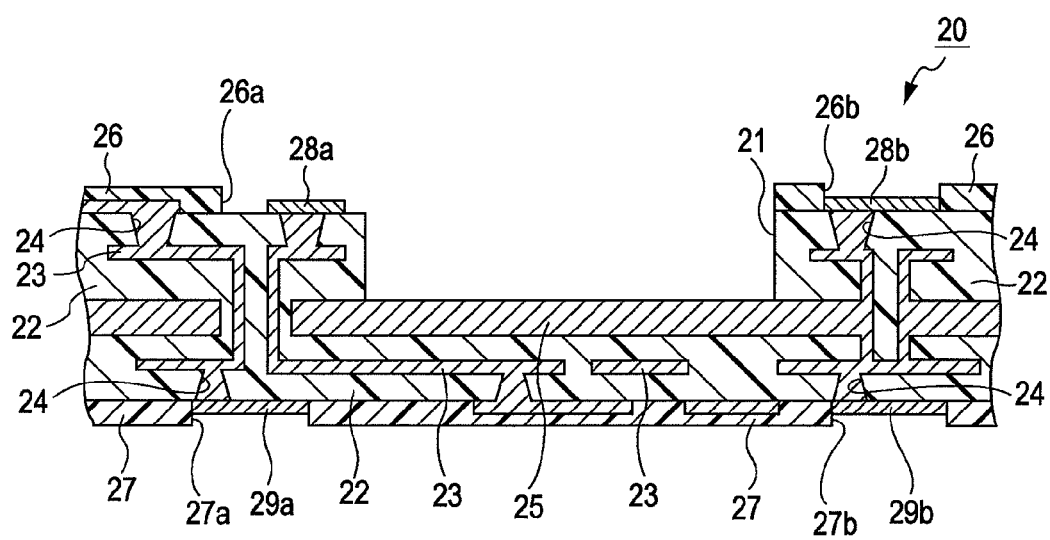
FIG. 5 illustrates an exemplary semiconductor package.

FIG. 5 illustrates an exemplary semiconductor package. The structure of the resin circuit board 20 illustrated in FIG. 5 is substantially the same as or similar to the structure illustrated in FIGS. 4A and 4B as in FIG. 5, the resin circuit board 20 may not have through-holes. The resin circuit board 20 illustrated in FIG. 4A has through-holes extending through the resin 22, for example, through-holes 31a and 31b. Copper is deposited on the inner wall surfaces of the through-holes 31a and 31b. The connection electrodes 28a on the front surface of the resin 22 and the connection electrodes 29a on the back surface of the resin 22 are coupled together through the through-holes 31a. The connection electrodes 28b on the front surface of the resin 22, the metal core 25, and the connection electrodes 29b on the back surface of the resin 22 are coupled together through the through-holes 31b. In the resin circuit board 20 illustrated in FIG. 5, the connection electrodes 28b on the front surface of the resin 22, the metal core 25, and the connection electrodes 29b on the back surface of the resin 22 are coupled together through the copper interconnects 23 and the vias 24.

The recess 21, where part of the surface of the metal core 25 is exposed, is formed at a certain position on the surface of the resin 22 and the solder resist 26 by laser process or router process. The recess 21 has a landscape-oriented rectangular shape larger than the compound semiconductor device 10, with three of the four sides of the periphery of the recess 21 extending along the connection electrodes 28a arranged in a line. After resin scattered during the process of the resin 22 is removed, the surfaces of the connection electrodes 28a and 29a exposed in the front surface and the surface of the metal core 25 exposed in the bottom surface of the recess 21 are plated with, for example, nickel and then gold. Although the metal core 25 exposed in the bottom surface of the recess 21 has a higher heat dissipation as its area fraction in the front surface of the resin circuit board 20 increases, the metal core 25 may optionally be patterned.

Figure 6A:
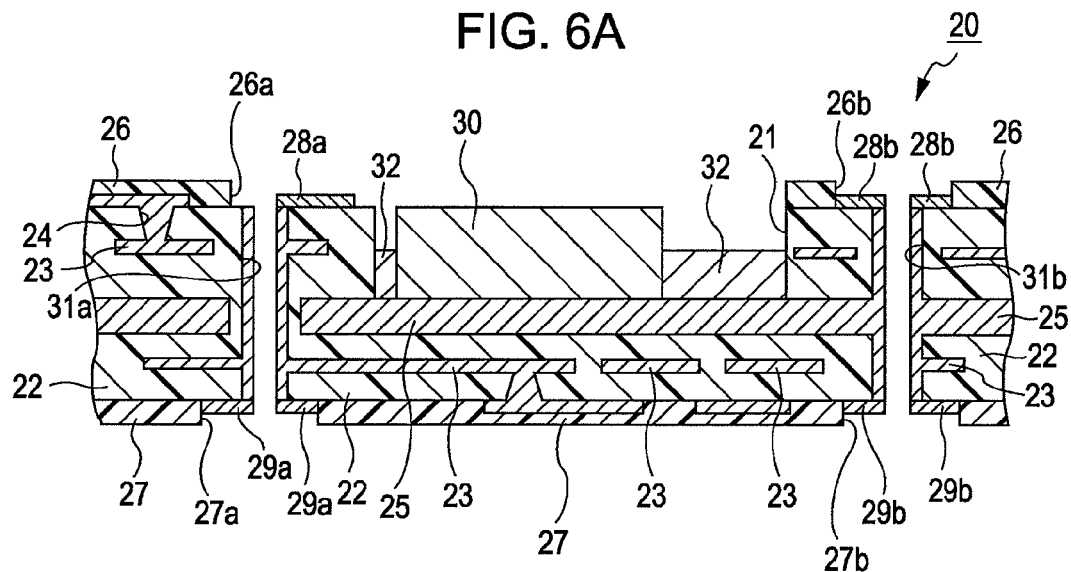
FIGS. 6A and 6B illustrate an exemplary semiconductor package.
Figure 6B:
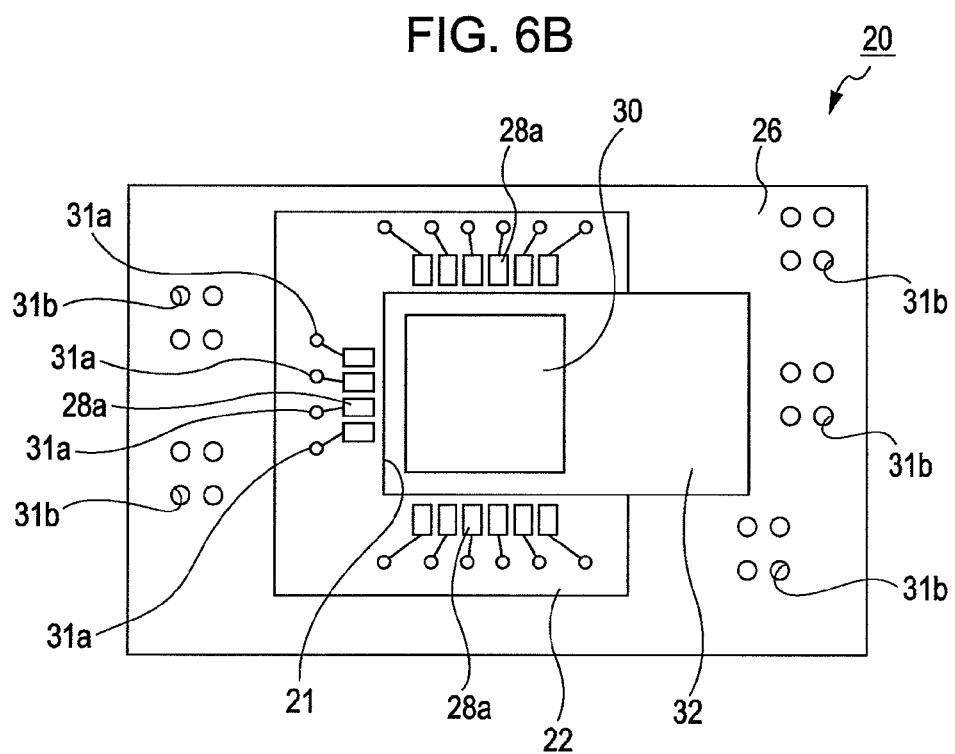

FIGS. 6A and 6B illustrate an exemplary semiconductor package. FIG. 6A indicates a sectional view, and FIG. 6B indicates a plan view. In FIGS. 6A and 6B, the resin circuit board 20 has the through-holes 31a and 31b. In the operation S4 in FIG. 1, as illustrated in FIGS. 6A and 6B, a dummy device 30 is disposed in the recess 21, and an adhesive material with high heat dissipation (heat-dissipating adhesive material), for example, a metal material 32, is supplied to the recess 21. For example, a dummy device 30 having substantially the same shape and size as the compound semiconductor device 10 is disposed at a position where the compound semiconductor device 10 is to be fixed in the recess 21. The dummy device 30 may include, for example, silicon, glass, or ceramic. The fixing position may be on the bottom surface of the recess 21. Three sides of the dummy device 30, for example, the sides corresponding to the three sides of the compound semiconductor device 10 where the connection electrodes 11 are formed, may be separated from the periphery of the recess 21 by about 0.01 to 0.1 mm, for example, about 0.05 mm. The remaining side of the dummy device 30, for example, the side corresponding to the side of the compound semiconductor device 10 where the connection electrodes 11 are not formed, may be separated from the periphery of the recess 21 by about 4 mm or more, for example, about 10.05 mm.

The dummy device 30 is disposed at the position where the compound semiconductor device 10 is to be fixed, and the metal material 32, for example, a silver (Ag) sintering paste, is supplied to the recess 21 so as to have a thickness for at least partially covering the side surfaces of the dummy device 30. The thickness may be a certain thickness. The certain thickness, for example, the thickness of the sintering paste, may be larger than or equal to half the height of the side surfaces of the dummy device 30 (middle position), for example, larger than or equal to half the thickness of the compound semiconductor device 10 (middle position).

Instead of a silver sintering paste, the metal material 32 may be, for example, at least one material selected from gold and copper sintering pastes. Instead of a metal material, the heat-dissipating adhesive material may be an insulating material such as a BN or AlN paste. A conductive paste including diamond (C) may also be used.

Figure 7A:
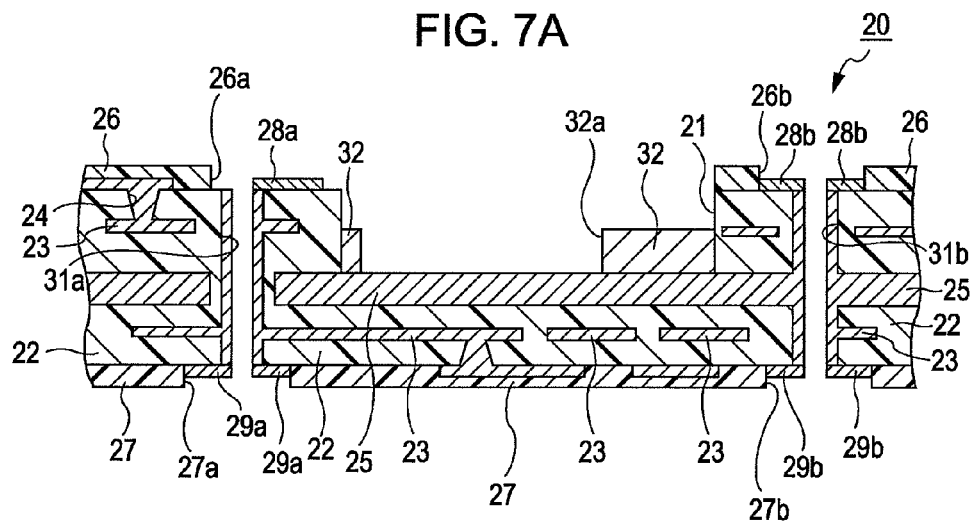
FIGS. 7A and 7B illustrate an exemplary semiconductor package.
Figure 7B:
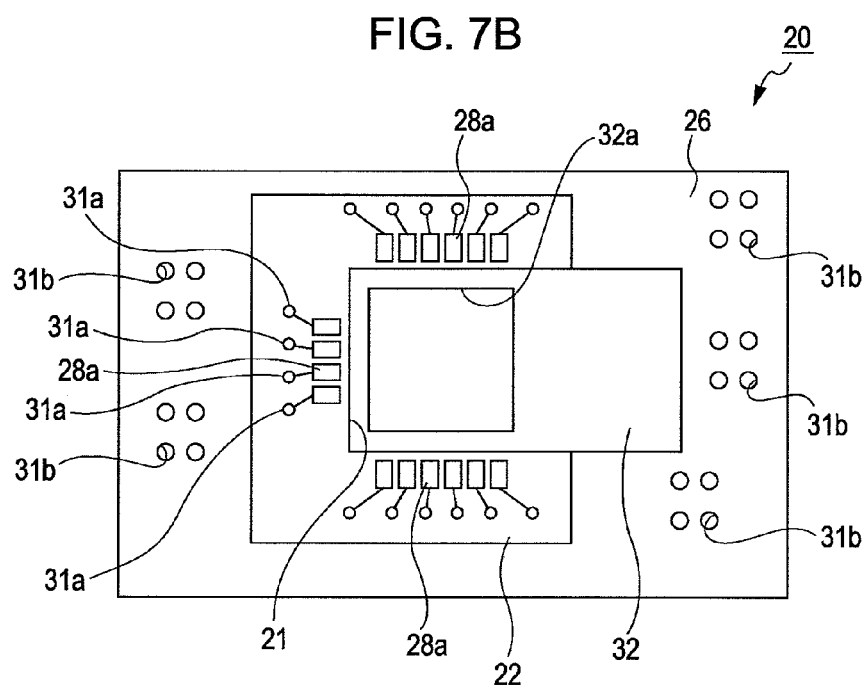

FIGS. 7A and 7B illustrate an exemplary semiconductor package. FIG. 7A indicates a sectional view, and FIG. 7B indicates a plan view. In FIGS. 7A and 7B, the resin circuit board 20 has the through-holes 31a and 31b. In the operation S5 in FIG. 1, as illustrated in FIGS. 7A and 7B, the dummy device 30 is removed. After the dummy device 30 is removed, the metal material 32 having the certain thickness is left on the entire surface in the recess 21 excluding the position where the compound semiconductor device 10 is to be fixed. The fixing position defined in the recess 21 by the metal material 32 may be a fixing position 32a.

Figure 8A:
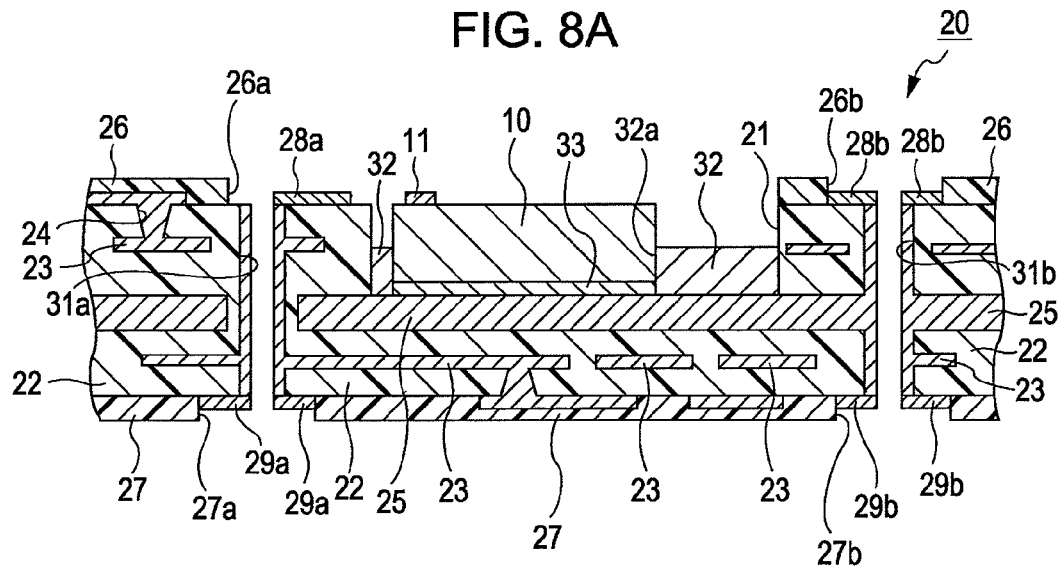
FIGS. 8A and 8B illustrate an exemplary semiconductor package.
Figure 8B:
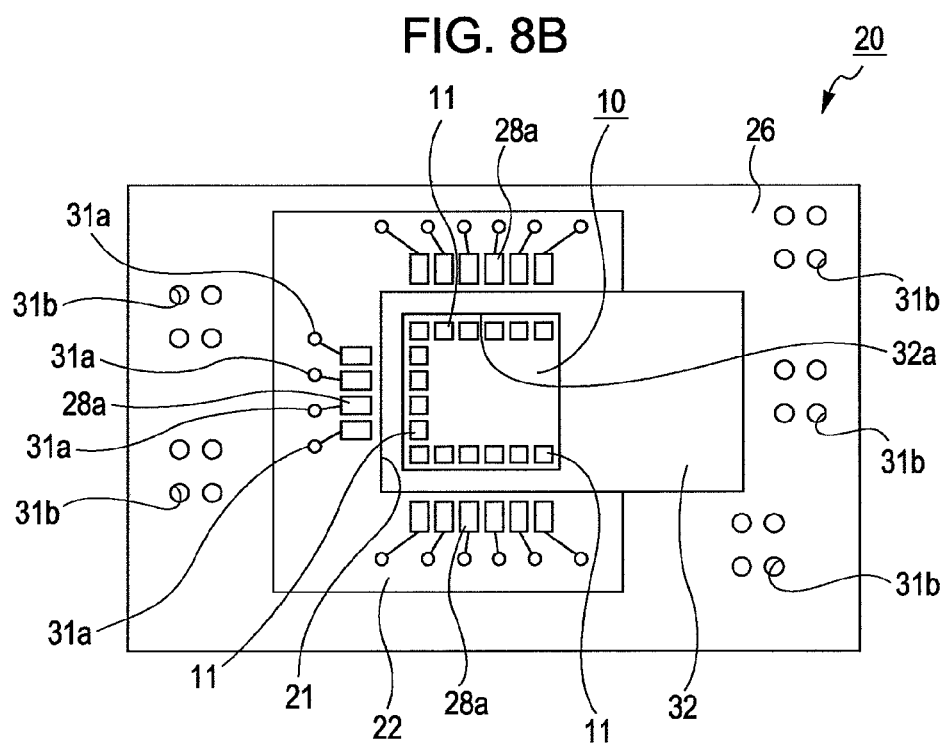

FIGS. 8A and 8B illustrate an exemplary semiconductor package. FIG. 8A indicates a sectional view, and FIG. 8B indicates a plan view. In FIGS. 8A and 8B, the resin circuit board 20 has the through-holes 31a and 31b. In the operation S6 in FIG. 1, as illustrated in FIGS. 8A and 8B, the compound semiconductor device 10 with a metal material 33 on its back surface is bonded in the recess 21 of the resin circuit board 20. The metal material 33 is applied to the back surface of the semiconductor device 10 with a certain thickness, for example, a thickness smaller than that of the metal material 32. A silver sintering paste that is substantially the same as the metal material 32 may be used as the metal material 33 or a different metal, for example, at least one material selected from gold and copper sintering pastes may be used. The compound semiconductor device 10 having the metal material 33 applied to the back surface thereof is provisionally fixed to the fixing position 32a face-up in the recess 21. The compound semiconductor device 10 may be provisionally fixed under a pressure of, for example, about 2 kgf. The metal materials 32 and 33 are hardened at about 150° C. to 250° C., for example, about 200° C. under atmospheric pressure for about one hour. Thus, the compound semiconductor device 10 is bonded to the fixing position 32a in the recess 21.

The metal material 33 is applied to the back surface of the compound semiconductor device 10. Alternatively, a metal material may be applied to the surface of the metal core 25 at the fixing position 32a in the recess 21 with substantially the same thickness, and the compound semiconductor device 10 may be disposed on the metal material. In this case, provisional fixing and hardening may be carried out under substantially the same conditions as above.

Because the metal material 32 is formed using the dummy device 30, the metal material 32 has a certain thickness so as to cover the side surfaces of the compound semiconductor device 10. The metal material 32 covers the side surfaces of the compound semiconductor device 10 between the sides of the compound semiconductor device 10 where the connection electrodes 11 are formed and the periphery of the recess 21. For example, the distance between the sides of the compound semiconductor device 10 where the connection electrodes 11 are formed and the periphery of the recess 21 may reduce or be in contact for shorter in order to short metal wires. The metal material 32 may not be in the distance. Because the heat dissipation effect of the metal material 32 is proportional to its size, for example, its surface area, the metal material 32 may not be in the distance. The compound semiconductor device 10 may be bonded with a metal material without using the dummy device 30.

Figure 9A:
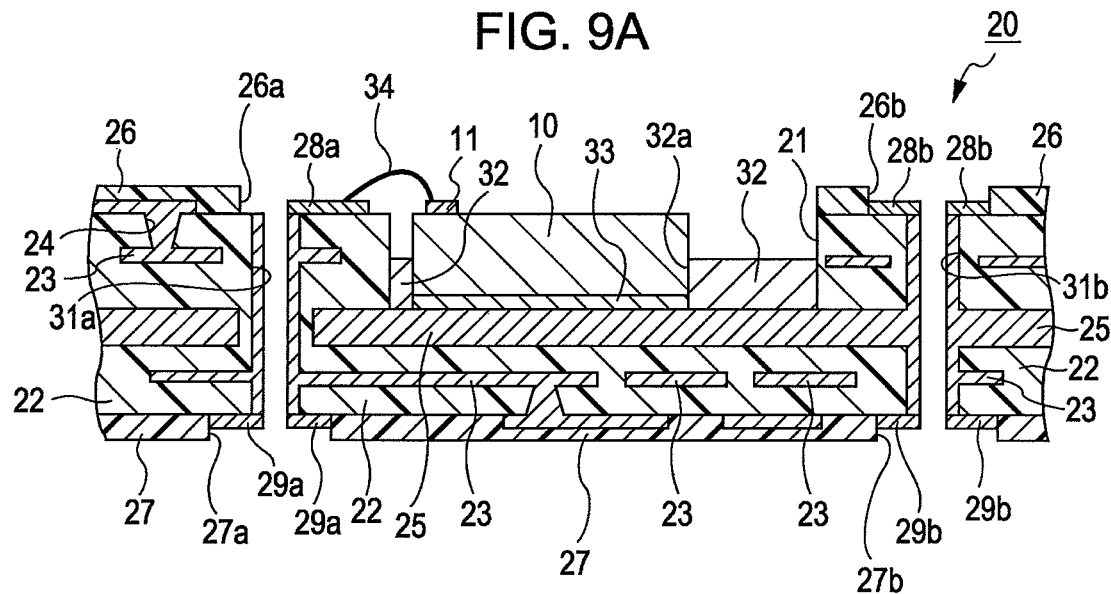
FIGS. 9A and 9B illustrate an exemplary semiconductor package.
Figure 9B:
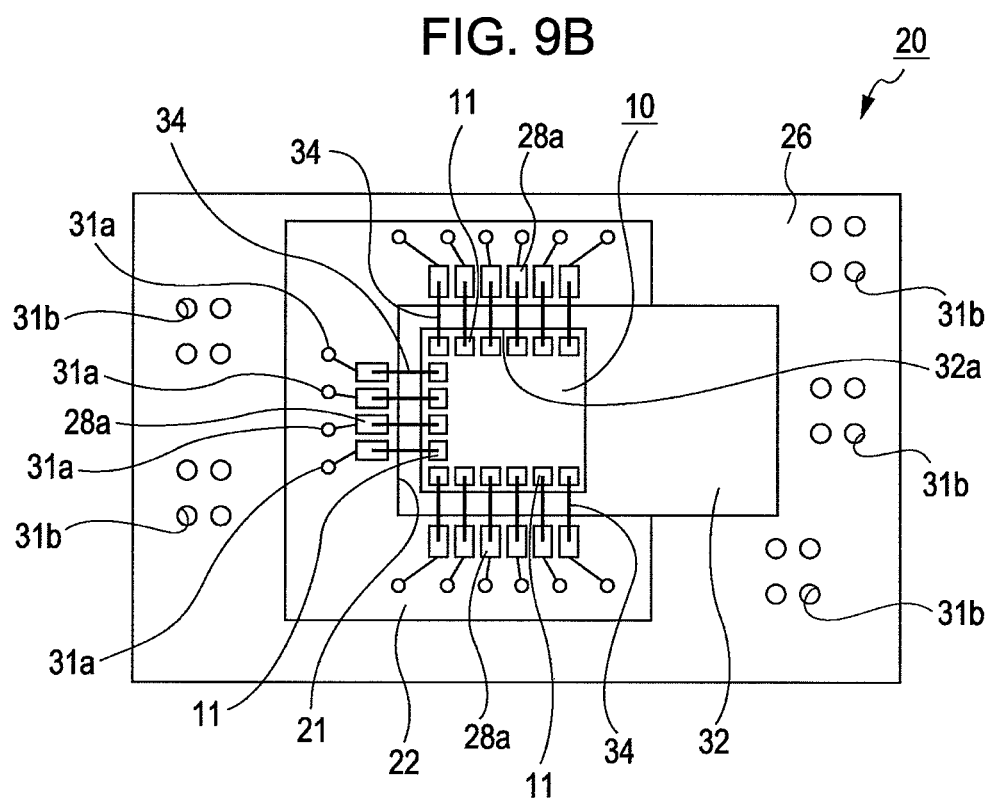

FIGS. 9A and 9B illustrate an exemplary semiconductor package. FIG. 9A indicates a sectional view, and FIG. 9B indicates a plan view. In FIGS. 9A and 9B, the resin circuit board 20 has the through-holes 31a and 31b. In the operation S7 in FIG. 1, as illustrated in FIGS. 9A and 9B, the connection electrodes 11 of the compound semiconductor device 10 and the connection electrodes 28a of the resin circuit board 20 are coupled together by wire bonding. Metal wires 34 are used to couple the facing connection electrodes 11 and 28a on the three sides of the compound semiconductor device 10 and the three sides of the resin circuit board 20. For example, aluminum wires having a diameter of about 100 to 2,500 μM, for example, about 100 μm, and a length of, for example, about 0.1 mm is used as the metal wires 34. Instead of aluminum wires, metal wires selected from gold, copper, and palladium wires is used as the metal wires 34. Thus, a semiconductor package is fabricated.

The compound semiconductor device 10 is fixed in the recess 21 formed on the resin circuit board 20 with the metal materials 32 and 33. The compound semiconductor device 10 may be disposed at a certain position on the bottom surface of the recess 21. The compound semiconductor device 10 may be disposed such that the three sides of the periphery of the compound semiconductor device 10 where the connection electrodes 11 are disposed are separated from the periphery of the recess 21 by a smaller distance, whereas the side where the connection electrodes 11 are not disposed is separated from the periphery of the recess 21 by a larger distance. In the wide region corresponding to the larger distance between the periphery of the compound semiconductor device 10 and the periphery of the recess 21, the metal material 32 is applied so as to have a thickness to cover the side surface of the compound semiconductor device 10 to a certain position. Heat is efficiently dissipated through the metal materials 32 and 33 from the bottom and side surfaces of the compound semiconductor device 10, for example, from the portion covered with the metal material 32. Heat dissipation may be improved because the metal material 32 occupies a large area. In the narrow regions corresponding to the smaller distance between the periphery of the compound semiconductor device 10 and the periphery of the recess 21, the metal wires 34 couple the facing connection electrodes 11 and 28a. Low-resistance transmission is performed because the metal wires 34 become shorter.

Thus, provided is a low-cost semiconductor package of the compound semiconductor device 10 that allows low-resistance transmission and high heat dissipation with a simple structure.

Figure 10:
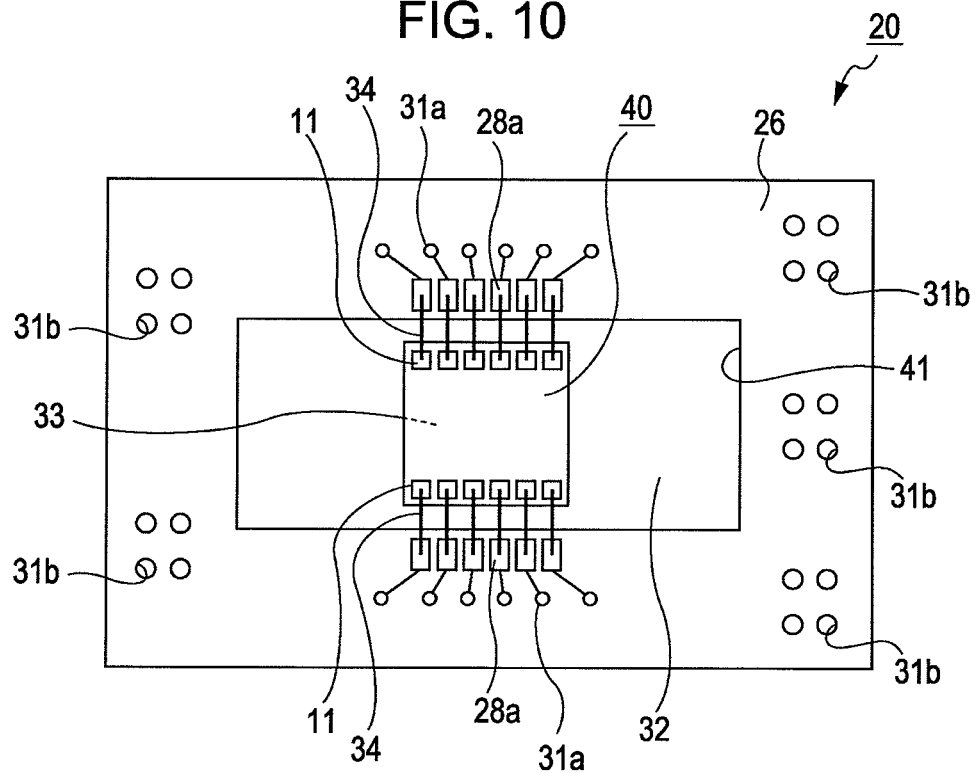
FIG. 10 illustrates an exemplary semiconductor package.

FIG. 10 illustrates an exemplary semiconductor package. The semiconductor package illustrated in FIG. 10 may correspond to the semiconductor package illustrated in FIG. 9B. In FIG. 10, the elements that are substantially the same as or similar to those of the semiconductor package illustrated in FIG. 9B may be denoted by the same reference numerals, and a description thereof may be omitted or reduced. The semiconductor package may be fabricated through the operations S1 to S7 in FIG. 1. Referring to FIG. 10, a compound semiconductor device 40 has connection electrodes 11 for external connection arranged in a line along facing two of the four sides of the rectangular periphery thereof. The resin circuit board 20 has a recess 41 where part of the surface of the metal core is exposed. The recess 41 has a landscape-oriented rectangular shape larger than the compound semiconductor device 40, with two facing sides of the periphery of the recess 41 extending along the connection electrodes 28a arranged in a line.

In the recess 41, the side surfaces of the compound semiconductor device 40 are fixed with the metal material 32, and the bottom surface is fixed with the metal material 33. The two facing sides where the connection electrodes 11 are formed are separated from the periphery of the recess 41 by about 0.01 to 0.1 mm, for example, about 0.05 mm. The two facing sides where the connection electrodes 11 are not formed are separated from the periphery of the recess 41 by about 4 mm or more, for example, about 6.5 mm.

The compound semiconductor device 40 is fixed in the recess 41 formed on the resin circuit board 20 with the metal materials 32 and 33. The compound semiconductor device 40 may be disposed at a certain position on the bottom surface of the recess 41. The compound semiconductor device 40 may be disposed such that the two sides of the periphery of the compound semiconductor device 40 where the connection electrodes 11 are disposed are separated from the periphery of the recess 41 by a smaller distance, whereas the two sides where the connection electrodes 11 are not disposed are separated from the periphery of the recess 41 by a larger distance. In the wide regions corresponding to the larger distance between the periphery of the compound semiconductor device 40 and the periphery of the recess 41, the metal material 32 is applied so as to have a thickness to cover the side surfaces of the compound semiconductor device 40 to a certain position. Heat is efficiently dissipated through the metal materials 32 and 33 from the bottom and side surfaces of the compound semiconductor device 40, for example, from the portion covered with the metal material 32. Heat dissipation may be improved because the metal material 32 occupies a large area. In the narrow regions corresponding to the smaller distance between the periphery of the compound semiconductor device 40 and the periphery of the recess 41, the metal wires 34 couple the facing connection electrodes 11 and 28a. Low-resistance transmission is performed because the metal wires 34 become shorter.

Thus, provided is a low-cost semiconductor package of the compound semiconductor device 40 that allows low-resistance transmission and high heat dissipation with a simple structure.

Figure 11:
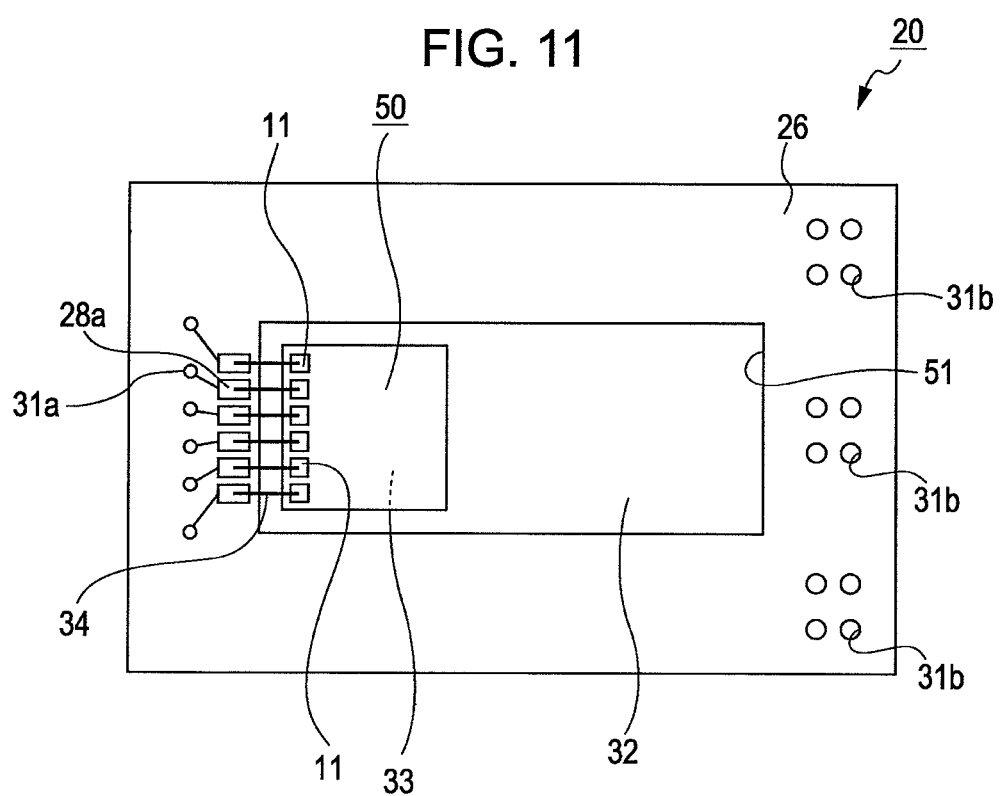
FIG. 11 illustrates an exemplary semiconductor package.

FIG. 11 illustrates an exemplary semiconductor package. The semiconductor package illustrated in FIG. 11 may correspond to the semiconductor package illustrated in FIG. 9B. In FIG. 11, the elements that are substantially the same as or similar to those of the semiconductor package illustrated in FIG. 9B may be denoted by the same reference numerals, and a description thereof may be omitted reduced. The semiconductor package may be fabricated through the operations S1 to S7 in FIG. 1. Referring to FIG. 11, a compound semiconductor device 50 has connection electrodes 11 for external connection arranged in a line along one of the four sides of the rectangular periphery thereof. The resin circuit board 20 has a recess 51 where part of the surface of the metal core is exposed. The recess 51 has a landscape-oriented rectangular shape larger than the compound semiconductor device 50, with one side of the periphery of the recess 51 extending along the connection electrodes 28a arranged in a line.

In the recess 51, the side surfaces of the compound semiconductor device 50 are fixed with the metal material 32, and the bottom surface is fixed with the metal material 33. The side of the compound semiconductor device 50 where the connection electrodes 11 are formed is separated from the periphery of the recess 51 by about 0.01 to 0.1 mm, for example, about 0.05 mm. The three sides where the connection electrodes 11 are not formed are separated from the periphery of the recess 51 by about 4 mm or more, for example, about 10.05 mm.

The compound semiconductor device 50 is fixed in the recess 51 formed on the resin circuit board 20 with the metal materials 32 and 33. The compound semiconductor device 50 may be disposed at a certain position on the bottom surface of the recess 51. The compound semiconductor device 50 may be disposed such that three sides of the periphery of the compound semiconductor device 50 are separated from the periphery of the recess 51 by a smaller distance, whereas the remaining side is separated from the periphery of the recess 51 by a larger distance. In the wide region corresponding to the larger distance between the periphery of the compound semiconductor device 50 and the periphery of the recess 51, the metal material 32 is applied so as to have a thickness to cover the side surface of the compound semiconductor device 50 to a certain position. Heat is efficiently dissipated through the metal materials 32 and 33 from the bottom and side surfaces of the compound semiconductor device 50, for example, from the portion covered with the metal material 32. Heat dissipation may be improved because the metal material 32 occupies a large area. In the narrow regions corresponding to the smaller distance between the periphery of the compound semiconductor device 50 and the periphery of the recess 51, the metal wires 34 couple the opposing facing electrodes 11 and 28a. Low-resistance transmission is performed because the metal wires 34 become shorter.

Thus, provided is a low-cost semiconductor package of the compound semiconductor device 50 that allows low-resistance transmission and high heat dissipation with a simple structure.

Figure 12:
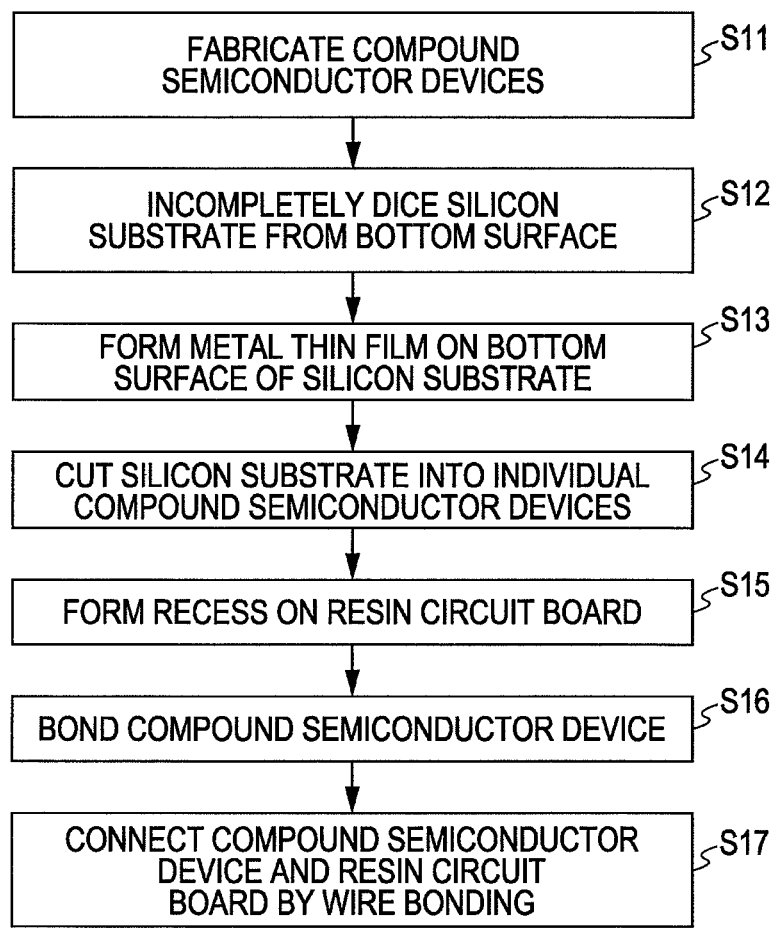
FIG. 12 illustrates an exemplary semiconductor package manufacturing process.

FIG. 12 illustrates an exemplary semiconductor package manufacturing process. In an operation S11 in FIG. 12, AlGaN/GaN HEMTs are fabricated similarly to the operation S1 illustrated in FIG. 1.

Figure 13A:
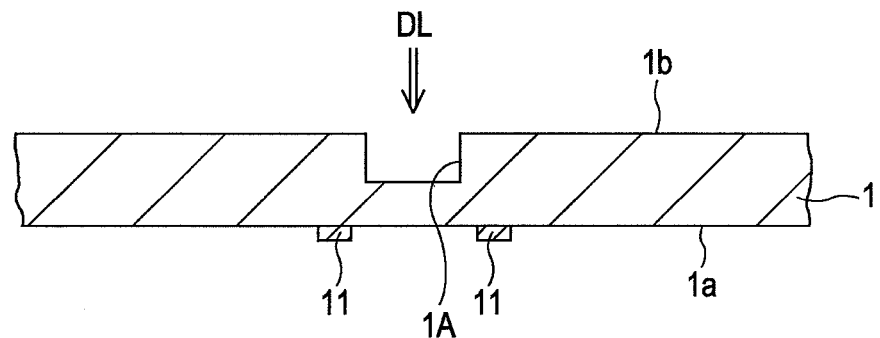
FIGS. 13A to 13C illustrate an exemplary dicing.

In an operation S12 in FIG. 12, as illustrated in FIG. 13A, the silicon substrate 1 having the AlGaN/GaN HEMTs fabricated in the operation S11 is incompletely diced. For example, the silicon substrate 1 is incompletely diced from the back surface 1b (opposite the front surface 1a) thereof along dicing lines DL formed thereon using, for example, a certain blade or laser (laser dicing). The dicing may be incomplete when terminated. For example, the dicing may be terminated when grooves 1A that appear in dicing becomes the depth corresponding to the height to which molten metal material is to cover the side surfaces of the compound semiconductor devices. The depth of the grooves 1A may be larger than or equal to half the thickness of the compound semiconductor devices (middle position).

Figure 13B:
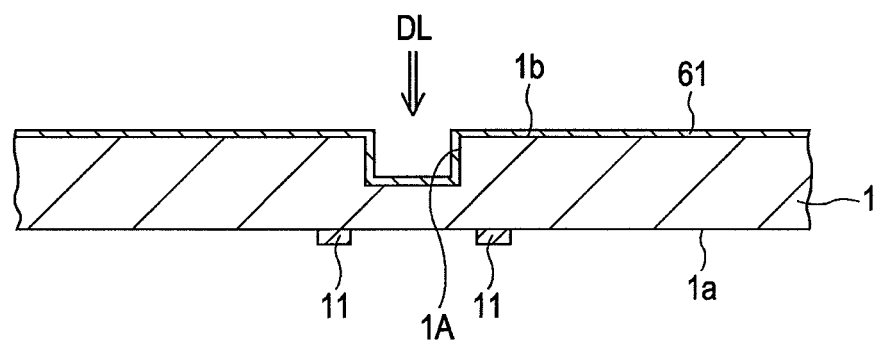
Figure 13C:
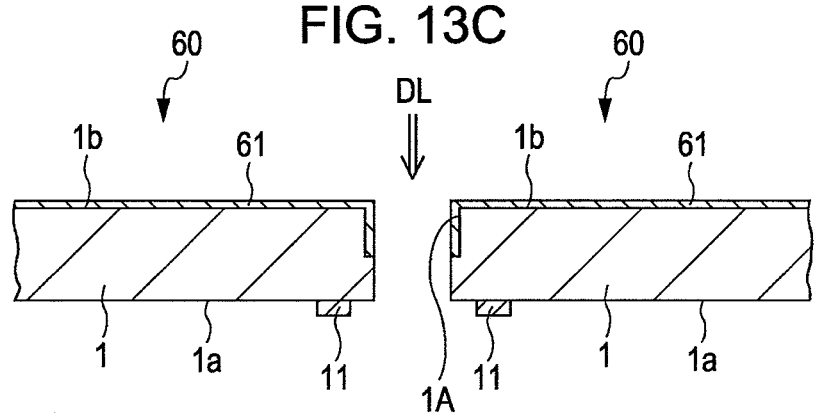

FIGS. 13A to 13C illustrate an exemplary dicing. In an operation S13, as illustrated in FIG. 13B, a metal thin film 61 for improving wettability to molten metal material is formed on the back surface 1b of the silicon substrate 1 so as to cover the inner wall surfaces of the grooves 1A. For example, a metal having the property of improving wettability to molten metal material, for example, a multilayer film of titanium, nickel, and gold, is formed by, for example, sputtering, vacuum deposition, or plasma-enhanced CVD. Thus, the metal thin film 61 is formed. Instead of a multilayer film of titanium, nickel, and gold, a multilayer film of one or more metals selected from gold, copper, nickel, aluminum, titanium, and palladium may be used as the metal thin film 61.

In an operation S14, as illustrated in FIG. 13C, the silicon substrate 1 is cut into individual compound semiconductor devices 60 by laser dicing along the dicing lines DL on the bottom surface 1b of the silicon substrate 1. The metal thin film 61, which covers the compound semiconductor device 60 from the entire bottom surface 1b to a certain height along the side surfaces, are formed in Each compound semiconductor device 60. As with the compound semiconductor device 10 illustrated in FIG. 3, a plurality of connection electrodes 11 are arranged in a line along three of the four sides of the rectangular periphery of the compound semiconductor device 60.

In an operation S15, a recess is formed on the front surface of a resin circuit board similarly to the operation S3 in FIGS. 4A and 4B.

Figure 14A:
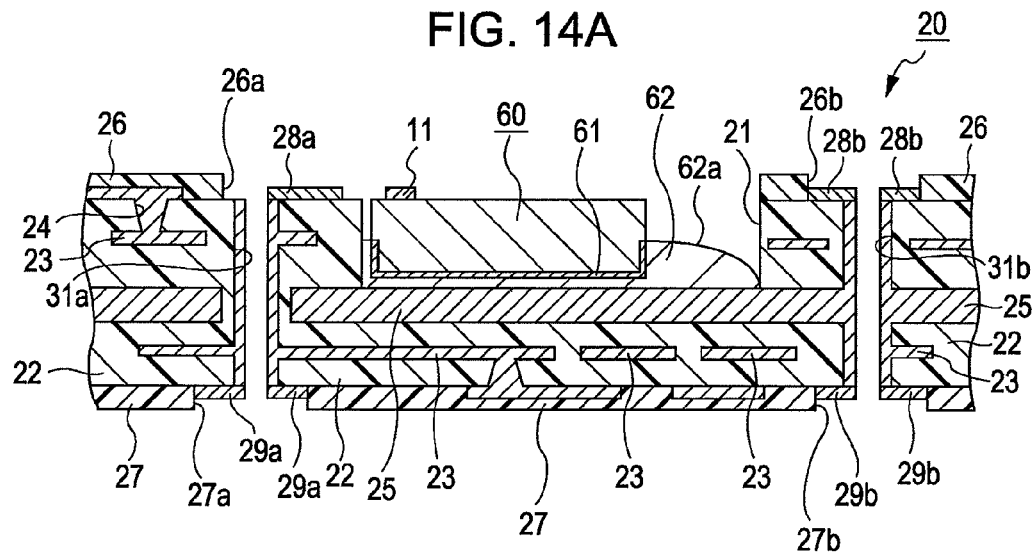
FIGS. 14A and 14B illustrate an exemplary semiconductor package.
Figure 14B:
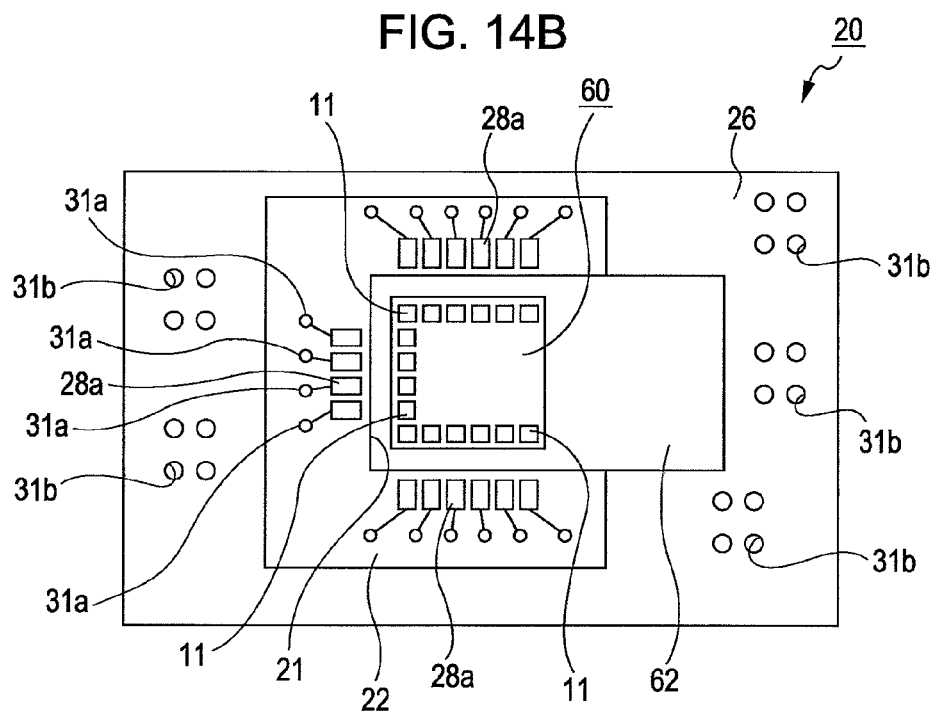

FIGS. 14A and 14B illustrate an exemplary semiconductor package. In an operation S16, as illustrated in FIGS. 14A and 14B, the compound semiconductor device 60 is bonded in the recess 21 of the resin circuit board 20. For example, the compound semiconductor device 60 is bonded to a predetermined position on the bottom surface of the recess 21 of the resin circuit board 20 with a molten metal material 62, for example, tin-silver (Sn—Ag). Instead of tin-silver, for example, tin-silver-bismuth (Sn—Ag—Bi), or a plurality of metals selected from tin, lead (Pb), silver, indium (In), bismuth, zinc (Zn), antimony (Sb), and copper may be used as the molten metal material 62. For example, the three sides of the compound semiconductor device 60 where the connection electrodes 11 are formed may be separated from the periphery of the recess 21 by about 0.01 to 0.1 mm, for example, about 0.05 mm. The side where the connection electrodes 11 are not formed may be separated from the periphery of the recess 21 by about 4 mm or more, for example, about 10.05 mm.

The metal thin film 61 for improving wettability to the molten metal material 62 is formed so as to cover the compound semiconductor device 60 from the entire bottom surface 1*b* to a certain height along the side surfaces. The molten metal material 62 contacts the compound semiconductor device 60 in the region where the metal thin film 61 is formed on the compound semiconductor device 60, for example, from the entire bottom surface 1*b* of the compound semiconductor device 60 to a certain height along the side surfaces. The portion of the molten metal material 62 that contacts one of the side surfaces of the compound semiconductor device 60 forms a gently convex surface 62*a* whose height decreases gradually from the side surface toward the sidewall of the recess 21 under the surface tension of the molten metal. The convex surface may have a larger surface area than a flat surface area of uniform height. The molten metal material 62 may maintain its shape after being solidified by cooling.

The metal material 62 covers the side surfaces of the compound semiconductor device 60 between the sides of the compound semiconductor device 60 where the connection electrodes 11 are formed and the periphery of the recess 21. For example, the sides of the compound semiconductor device 60 where the connection electrodes 11 are formed and the periphery of the recess 21 may be separated by a smaller distance or be in contact in order to short metal wires. The metal material 62 may not be in the small distance. Because the heat dissipation effect of the metal material 62 is proportional to its size, for example, its surface area, the metal material 62 may be in the narrow regions.

Figure 15A:
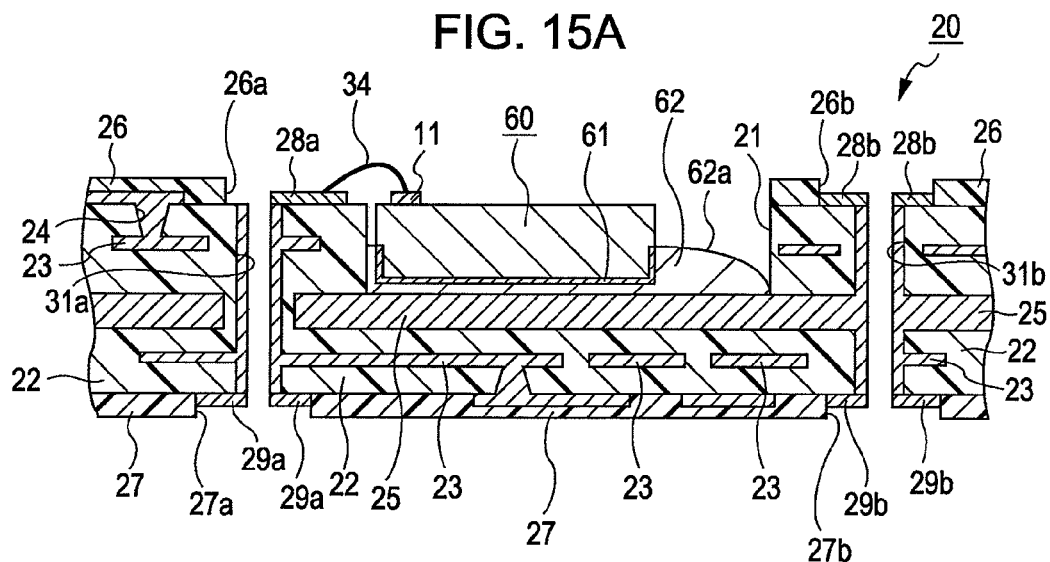
FIGS. 15A and 15B illustrate an exemplary semiconductor package.
Figure 15B:
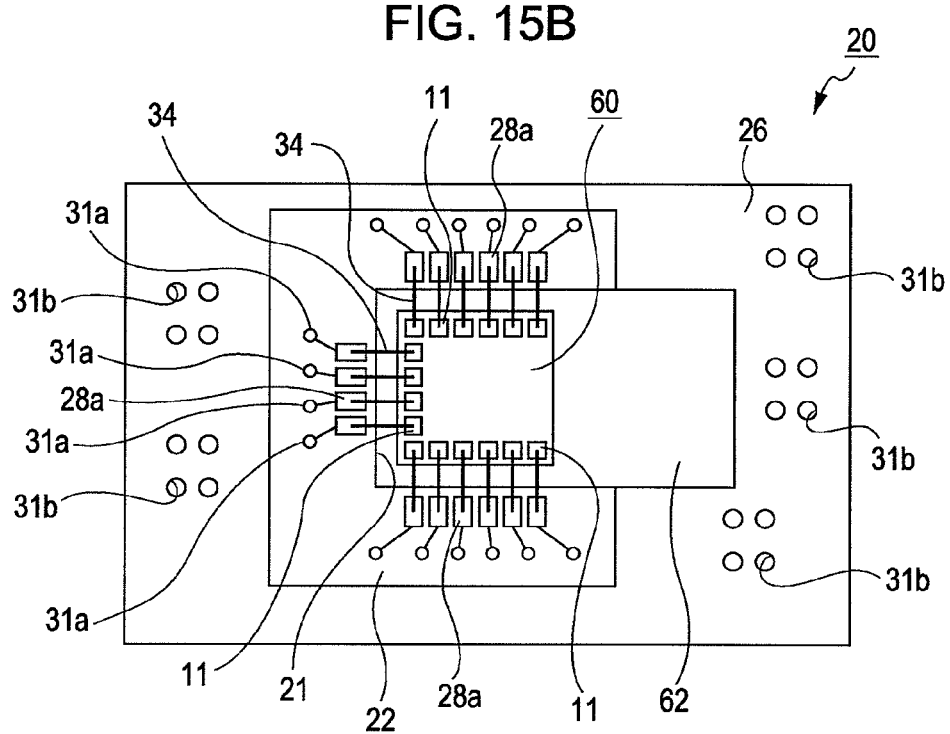

FIGS. 15A and 15B illustrate an exemplary semiconductor package. As illustrated in FIGS. 15A and 15B, in an operation S17 in FIG. 12, the connection electrodes 11 of the compound semiconductor device 60 and the connection electrodes 28*a* of the resin circuit board 20 are coupled together by wire bonding similarly to the operation S7 in FIG. 1. Thus, a semiconductor package is fabricated.

The compound semiconductor device 60 is fixed in the recess 21 formed on the resin circuit board 20 with the solidified metal material 62. The compound semiconductor device 60 may be disposed at a certain position on the bottom surface of the recess 21. The compound semiconductor device 60 may be disposed such that the three sides of the periphery of the compound semiconductor device 60 where the connection electrodes 11 are disposed are separated from the periphery of the recess 21 by a smaller distance, whereas the side where the connection electrodes 11 are not disposed is separated from the periphery of the recess 21 by a larger distance. In the wide region corresponding to the larger distance between the periphery of the compound semiconductor device 60 and the periphery of the recess 21, the molten metal material 62 is applied so as to have a thickness to cover the side surface of the compound semiconductor device 60 to a certain position. Heat is efficiently dissipated through the molten metal material 62 from the bottom and side surfaces of the compound semiconductor device 60, for example, from the portion covered with the molten metal material 62. Heat dissipation may be improved because the molten metal material 62 occupies a large area. The molten metal material 62 may form the gently convex surface 62*a* whose height decreases gradually from the side surface toward the sidewall of the recess 21. The convex surface 62*a* has a larger surface area and therefore dissipates a larger amount of heat than a flat surface area of uniform height. In the narrow regions corresponding to the smaller distance between the periphery of the compound semiconductor device 60 and the periphery of the recess 21, the metal wires 34 couple the facing connection electrodes 11 and 28*a*. Low-resistance transmission is performed because the metal wires 34 become shorter.

Thus, provided is a low-cost semiconductor package of the compound semiconductor device 60 that allows low-resistance transmission and high heat dissipation with a simple structure.

As in the semiconductor packages illustrated in FIGS. 10 and 11, a compound semiconductor device having the connection electrodes 11 formed along one or two sides thereof may be fixed in a recess of a resin circuit board with a molten metal material. A metal thin film for improving wettability to molten metal material may be formed on the compound semiconductor device through the operations S12 to S14 in FIG. 12.

Figure 16:
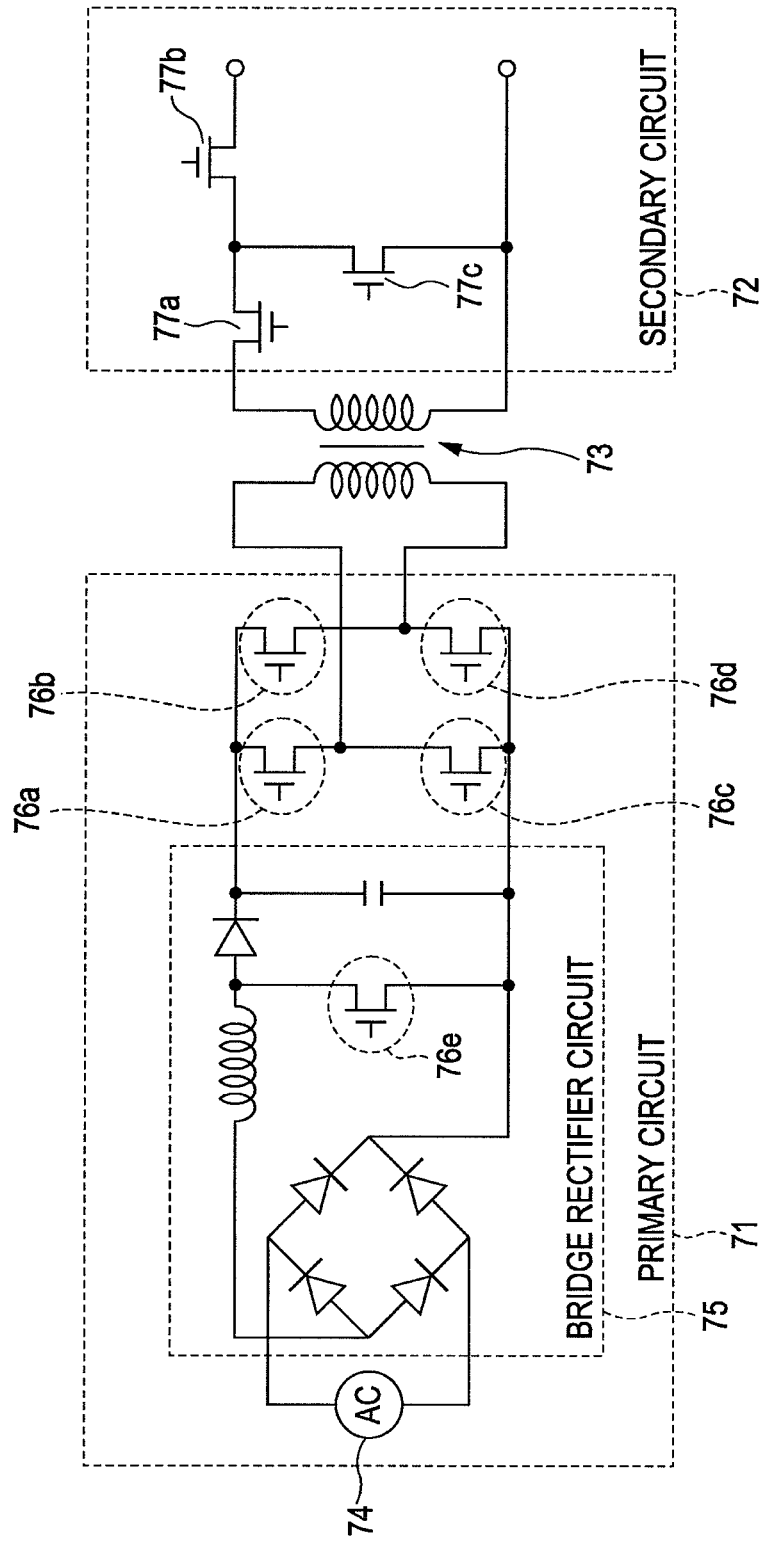
FIG. 16 illustrates an exemplary power supply device.

FIG. 16 illustrates an exemplary power supply device. The power supply device illustrated in FIG. 16 may include a semiconductor package manufactured by the manufacturing process illustrated in FIG. 1 or 12.

The power supply device includes a high-voltage primary circuit 71, a low-voltage secondary circuit 72, and a transformer 73 disposed between the primary circuit 71 and the secondary circuit 72. The primary circuit 71 includes an alternating-current power supply 74, a bridge rectifier circuit 75, and a plurality of switching devices, for example, four switching devices 76*a*, 76*b*, 76*c*, and 76*d*. The bridge rectifier circuit 75 includes a switching device 76*e*. The secondary circuit 72 includes a plurality of switching devices, for example, three switching devices 77*a*, 77*b*, and 77*c*.

The switching devices 76*a*, 76*b*, 76*c*, 76*d*, and 76*e* of the primary circuit 71 may be compound semiconductor devices, for example, AlGaN/GaN HEMTs, fabricated in the operation S1 in FIG. 1. The switching devices 77*a*, 77*b*, and 77*c* of the secondary circuit 72 may be metal-insulator-semiconductor field-effect transistors (MISFETs) including silicon.

Thus, a low-cost semiconductor package of a compound semiconductor device that allows low-resistance transmission and high heat dissipation with a simple structure is applied to a high-voltage circuit.

Figure 17:
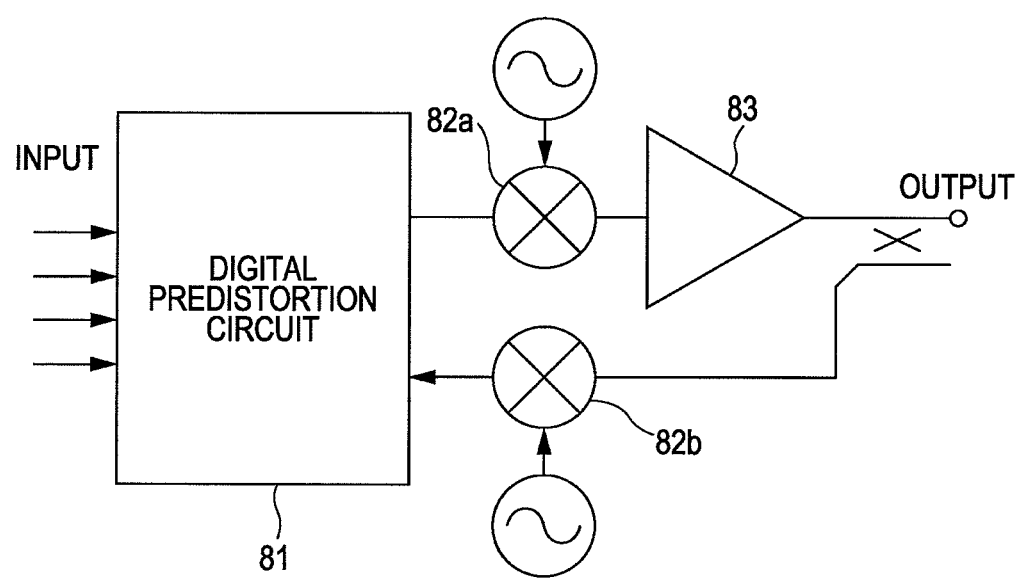
FIG. 17 illustrates an exemplary high-frequency amplifier.

FIG. 17 illustrates an exemplary high-frequency amplifier. The high-frequency amplifier illustrated in FIG. 17 may include a semiconductor package manufactured by the manufacturing process illustrated in FIG. 1 or 12.

The high-frequency amplifier includes a digital predistortion circuit 81, mixers 82a and 82b, and a power amplifier 83. The digital predistortion circuit 81 compensates for nonlinear distortion in an input signal. The mixer 82a mixes the input signal whose nonlinear distortion has been compensated for with an alternating-current signal. The power amplifier 83 amplifies the input signal mixed with the alternating-current signal. The power amplifier 83 includes a compound semiconductor device, for example, AlGaN/GaN HEMT, fabricated in the operation S1 in FIG. 1. For example, based on switching, the mixer 82b mixes the signal on the output side with an alternating-current signal and outputs the mixed signal to the digital predistortion circuit 81.

Thus, a low-cost semiconductor package of a compound semiconductor device that allows low-resistance transmission and high heat dissipation with a simple structure is applied to a high-voltage circuit.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor apparatus comprising:
   a semiconductor device including a first electrode which is provided on a top surface of the semiconductor device;
   a substrate including a recess and a second electrode which is provided on a top surface of the substrate facing the same direction of the top surface of the semiconductor device; and
   a heat-dissipating adhesive material to set the semiconductor device in the recess so as to arrange the first electrode close to the second electrode and cause a bottom surface of the semiconductor device to face a bottom surface of the recess,
   wherein the first electrode is coupled to the second electrode and the heat-dissipating adhesive material is provided between the bottom surface of the semiconductor device and the bottom surface of the recess and between a side surface of the semiconductor device and a side surface of the recess.

2. The semiconductor apparatus according to claim 1, wherein a first portion of the periphery of the semiconductor device where the first electrode is disposed and a second portion of the periphery of the recess where the second electrode is disposed face each other at a first distance; a third portion of the periphery of the semiconductor device where the first electrode is not disposed and a fourth portion of the periphery of the recess where the second electrode is not disposed face each other at a second distance being larger than the first distance; and the heat-dissipating adhesive material covers at least part of the side surface of the semiconductor device in the second portion.

3. The semiconductor apparatus according to claim 1, wherein the heat-dissipating adhesive material includes a metal material.

4. The semiconductor apparatus according to claim 3, wherein a portion of the metal material covering at least part of the side surface of the semiconductor device has a convex surface.

5. The semiconductor apparatus according to claim 3, wherein the semiconductor device includes a metal film extending from the bottom surface to a portion of the side surface which the metal material covers.

6. The semiconductor apparatus according to claim 3, wherein the metal material includes at least one material selected from the group consisting of tin, lead, silver, indium, bismuth, zinc, antimony, and copper.

7. The semiconductor apparatus according to claim 1, further comprising,
   a heat-dissipating metal disposed on a bottom surface of the recess.

8. The semiconductor apparatus according to claim 1, wherein the semiconductor device includes a compound semiconductor device.

9. An electronic device comprising, a semiconductor device including:
   a compound semiconductor device including a first electrode which is provided on a top surface of the semiconductor device;
   a substrate including a recess and a second electrode which is provided on a top surface of the substrate facing the same direction of the top surface of the semiconductor device; and
   a heat-dissipating adhesive material to set the semiconductor device in the recess so as to arrange the first electrode close to the second electrode and cause a bottom surface of the semiconductor device to face a bottom surface of the recess,
   wherein the first electrode is coupled to the second electrode and the heat-dissipating adhesive material is provided between the bottom surface of the semiconductor device and the bottom surface of the recess and between a side surface of the semiconductor device and a side surface of the recess.

10. The electronic device according to claim 9, wherein the semiconductor device includes a high-frequency amplifier to amplify an input high-frequency voltage.

11. The electronic device according to claim 9, wherein the semiconductor device includes: a transformer; and a high-voltage circuit and a low-voltage circuit arranged with the transformer therebetween.

12. The semiconductor apparatus according to claim 1, wherein a height of the heat-dissipating adhesive material provided between the side surface of the semiconductor device and the side surface of the recess is lower than a height of the side surface of the recess.

13. The electronic device according to claim 9, wherein a height of the heat-dissipating adhesive material provided between the side surface of the semiconductor device and the side surface of the recess is lower than a height of the side surface of the recess.

* * * * *